United States Patent
Chambers et al.

(10) Patent No.: US 7,395,287 B2
(45) Date of Patent: *Jul. 1, 2008

(54) NUMERICAL VALUE CONVERSION USING A SATURATION LIMITED ARITHMETIC LOGIC UNIT SUPPORTING VARIABLE RESOLUTION OPERANDS

(75) Inventors: Peter Chambers, Phoenix, AZ (US); Joseph James Judkins, III, Austin, TX (US)

(73) Assignee: Micrel, Inc., San Jose, CA (US)

( * ) Notice: Subject to any disclaimer, the term of this patent is extended or adjusted under 35 U.S.C. 154(b) by 713 days.

This patent is subject to a terminal disclaimer.

(21) Appl. No.: 10/759,988

(22) Filed: Jan. 15, 2004

(65) Prior Publication Data
US 2005/0131973 A1    Jun. 16, 2005

Related U.S. Application Data

(60) Provisional application No. 60/530,022, filed on Dec. 15, 2003.

(51) Int. Cl.
*G06F 15/00* (2006.01)
(52) U.S. Cl. ...................................... 708/206
(58) Field of Classification Search ................ 708/206, 708/530, 552
See application file for complete search history.

(56) References Cited

U.S. PATENT DOCUMENTS

| | | | | | |
|---|---|---|---|---|---|
| 4,282,578 | A | * | 8/1981 | Payne et al. | 702/86 |
| 5,371,694 | A | * | 12/1994 | Kawawaki et al. | 708/146 |
| 5,448,509 | A | * | 9/1995 | Lee et al. | 708/530 |
| 5,504,697 | A | * | 4/1996 | Ishida | 708/552 |
| 5,844,512 | A | | 12/1998 | Gorin et al. | |
| 5,942,992 | A | * | 8/1999 | Kelly | 340/870.21 |
| 6,043,804 | A | | 3/2000 | Greene | |

* cited by examiner

*Primary Examiner*—Chuong D Ngo
(74) *Attorney, Agent, or Firm*—Patent Law Group LLP; Carmen C. Cook

(57) ABSTRACT

A device for performing numerical value conversion of a digital input value in a first unit to a second, natural unit where the digital input value is a digitized value of a first measurement parameter includes a look-up table storing an array of coefficients for performing the numerical value conversion for multiple measurement parameters. The look-up table is indexed using a first parameter indicative of the first measurement parameter to provide a selected coefficient. The device further includes an arithmetic logic unit (ALU) receiving the digital input value and the selected coefficient and performing the numerical value conversion based on a first equation and the selected coefficient to compute a digital output value. The device also includes a saturation-limit circuit coupled to receive the digital output value from the arithmetic logic unit and provide a predetermined output value when the digital output value exceeds a predetermined maximum value.

15 Claims, 5 Drawing Sheets

NUMERICAL VALUE CONVERSION USING A SATURATION LIMITED ARITHMETIC LOGIC UNIT SUPPORTING VARIABLE RESOLUTION OPERANDS

CROSS-REFERENCE TO RELATED APPLICATIONS

This application claims the benefit of U.S. Provisional Patent Application Ser. No. 60/530,022, filed on Dec. 15, 2003, having the same title and inventorship hereof, which application is incorporated herein by reference in its entirety.

This application is related to concurrently filed and commonly assigned U.S. patent application Ser. No. 10/759,786. entitled "Numerical Value Conversion Using A Look-Up Table For Coefficient Storage," of the same inventors hereof.

FIELD OF THE INVENTION

The invention relates to a device for performing numerical value conversion and, in particular, to a device for performing numerical value conversion including an arithmetic logic unit that is saturation limited and supports variable resolution operands.

DESCRIPTION OF THE RELATED ART

The present invention concerns devices that are used to convert numerical values from one unit system to another unit system. For example, an analog-to-digital convert (ADC) is often used to digitize an analog data source into digital values. The digital values, sometimes referred to as "digital bits," often have to be expressed as real-world parameters, such as voltage, current, and temperature. In operation, the ADC digitizes the analog data source (temperature, voltage or current) into digital values in arbitrary units. Then, the ADC uses an arithmetic logic unit (ALU) to convert the digital values in an arbitrary unit into an appropriate real-world unit (e.g., degree Celsius, volts and ampere). For example, the ADC may digitize an input voltage value and provide values in whole numbers of millivolts as the digital output.

The numerical value conversion process uses one or more coefficients for transforming the digital values in arbitrary units into the desired real-world unit. Typically, the coefficients are stored in a memory or registers and are retrieved by the ALU to perform the conversion. Thus, in conventional systems, the coefficients are treated as constants to be applied for the conversion of all digitized values. However, in some applications, the values of the coefficients to be used may vary depending on certain parameters, such as the operating conditions of the device generating the analog data source or the device generating the digitized values. It is therefore desirable to provide a means to implement a numerical value conversion process that supports the use of multiple coefficients selected based on one or more parameters.

In most applications, an analog-to-digital converter is used to digitize a single analog data source. However, in some applications, it is desirable to use a single analog-to-digital converter to digitize multiple analog data sources. In that case, there is a requirement to convert digital values from the ADC into various physical units, each conversion requiring separate set of coefficients. It is desirable to provide a means to implement a numerical value conversion process that supports the use of multiple coefficients for realizing numerical value conversion into multiple units.

As described above, the conversion process in an ADC uses an ALU to carry out the numerical value transformation. An ALU typically includes built-in multiplication and addition functions and is often designed to operate with digital input values of a pre-determined bit length. However, when the ADC is used to digitize multiple analog input data sources, the digitized data values may have different bit lengths for the different analog data source. Thus, when a single ADC is used for digitizing multiple analog data source and the resultant digitized data are of variable resolution, separate ALUs are usually needed for converting the ADC results having variable bit lengths. In some applications, limitations on the size of the integrated circuit make it undesirable to provide multiple ALUs in order to support ADC functions providing variable bit length ADC results.

SUMMARY OF THE INVENTION

According to one embodiment of the present invention, a device for performing numerical value conversion of a digital input value in a first unit to a second unit being a natural unit where the first unit is related to the second unit by a first equation is disclosed. The digital input value is a digitized value of a first measurement parameter among multiple measurement parameters. The device includes a look-up table storing an array of coefficients for performing the numerical value conversion from the first unit to the second unit for each of the multiple measurement parameters. The look-up table is indexed using a first parameter to provide a selected coefficient where the first parameter is indicative of the first measurement parameter. The device further includes an arithmetic logic unit receiving the digital input value in the first unit and the selected coefficient from the look-up table. The arithmetic logic unit performs the numerical value conversion based on the first equation and using the selected coefficient to compute a digital output value in the second unit. Finally, the device includes a saturation-limit circuit coupled to receive the digital output value in the second unit from the arithmetic logic unit and provide a predetermined final output value when the digital output value exceeds a predetermined minimum or maximum value.

In another embodiment, the arithmetic logic unit is a fixed-function ALU capable of multiplication and addition operations only.

In yet another embodiment, the arithmetic logic unit is disposed to support digital input values having variable bit length.

According to another aspect of the present invention, a method for performing numerical value conversion of a digital input value in a first unit to a second unit being a natural unit where the first unit is related to the second unit by a first equation is disclosed. The digital input value is a digitized value of a first measurement parameter among multiple measurement parameters. The method includes storing an array of coefficients in a look-up table for performing the numerical value conversion from the first unit to the second unit where each of the multiple measurement parameters is associated with at least one coefficient in the array of coefficients, indexing the look-up table using a first parameter being indicative of the first measurement parameter to provide a selected coefficient, providing the digital input value and the selected coefficient to an arithmetic logic unit, and performing a numerical value conversion at the arithmetic logic unit based on the first equation and using the selected coefficient to compute a digital output value in the second unit from the digital input value in the first unit. The method further includes determining if the digital output value exceeds a predetermined maximum value, providing a first predetermined value as the final output value when the digital output value exceeds the predetermined maximum value, and providing the digital output value as the final output value when the digital output value does not exceed the predetermined maximum value.

In another embodiment, the method further includes determining if the digital output value is less than a predetermined minimum value, providing a second predetermined value as the final output value when the digital output value is less than the predetermined minimum value, and providing the digital output value as the final output value when the digital output value exceeds the predetermined minimum value.

The present invention is better understood upon consideration of the detailed description below and the accompanying drawings.

DETAILED DESCRIPTION OF THE PREFERRED EMBODIMENTS

Figure 1:
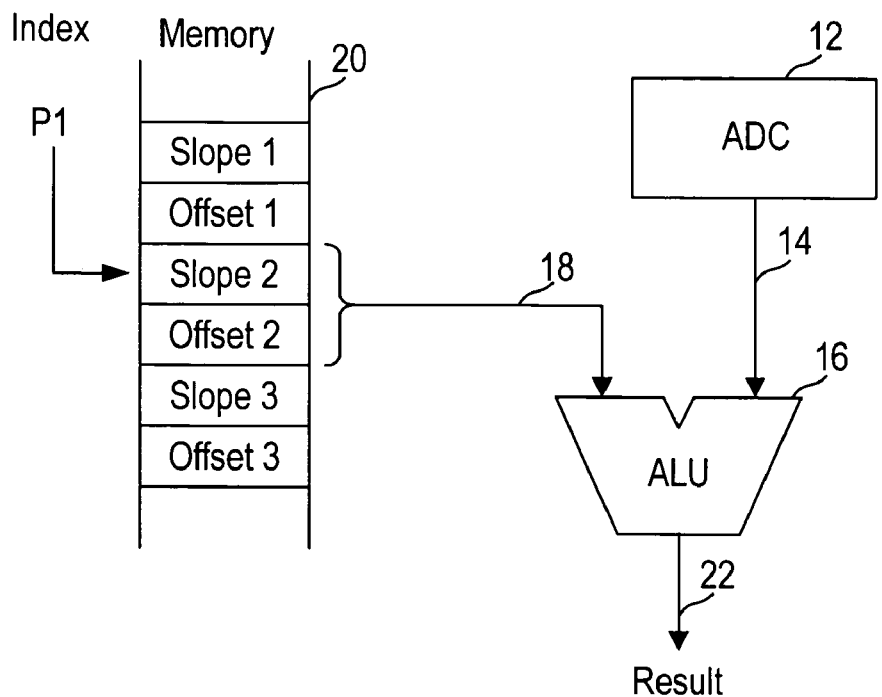
FIG. 1 is a schematic diagram of a device for performing numerical value conversion using a look-up table for coefficient storage according to one embodiment of the present invention.

In accordance with the principles of the present invention, a numerical value conversion device uses a look-up table for storing coefficients for performing conversion of a digital value in one unit to a digital value in another unit. The look-up table can be indexed by one or more parameters to provide the desired coefficients for use in the conversion computation. Furthermore, the look-up table can store coefficients for providing linear or non-linear conversions. In one embodiment, the look-up table is indexed by an operating parameter, such as temperature, and the look-up table stores coefficients for providing a linear conversion incorporating temperature compensation. In another embodiment, the look-up table is indexed by a portion of the most significant bits of the digital input value and the look-up table stores coefficients for providing numerical value conversion in a piecewise-linear fashion. The piecewise-linear conversion is used to approximate non-linear conversions, such as a logarithm conversion from a voltage value into Decibels. By using a look-up table for coefficient storage, complex numerical value conversion can be performed with simple and minimum circuitry. The numerical value conversion method and device of the present invention can be applied to systems where device size and operation speed is critical.

According to another aspect of the present invention, a numerical value conversion device is coupled to perform numerical value conversion of digital input values derived from multiple data sources (or input channels) using coefficients stored in a look-up table. The look-up table is indexed by a selection parameter to provide the appropriate coefficients for the digital input value being processed. The numerical value conversion device includes an ALU that supports digital input values having variable resolution and provides digital output values also in variable resolution. Finally, the numerical value conversion device is saturation-limited so that a reasonable output value is always provided regardless of possible errors in the digital input values.

Numerical Value Conversion Using a Look-Up Table

The numerical value conversion method and device of the present invention can be applied to perform conversion of digital input values from any data source. Basically, the numerical value conversion method of the present invention can be used to convert digital input values expressed in a first unit system to digital output values expressed in a second unit system. The relationship between the first unit system and the second unit system can be linear or non-linear.

However, applying the method and device of the present invention in an analog-to-digital converter provides particular advantages where conversion of the ADC results into natural units is often required. As mentioned above, ADC typically generates digital values in an arbitrary unit and the digital values have to be converted into a real-world unit or a natural unit to be useful. In the present description, real-world units or natural units refer to units of physical measurement such as degree Centigrade, volts, ampere, Decibels and watts. In the following description, the numerical value conversion method and device are described as being implemented in an analog-to-digital converter coupled to digitize one or more analog data source. However, the implementation of the method and device of the present invention in an analog-to-digital converter is illustrative only. In other embodiments, the numerical value conversion method or device can be applied for performing numerical value conversion of other digital data source whether provided by an ADC or not. In the present description, the digital output values of an analog-to-digital converter is referred to as the ADC results or the digital bits and are the digital input values into the numerical value conversion device of the present invention.

Analog to digital converters generally produce results that are not comprehensible as natural units. For example, an ADC measuring voltage to a resolution of eight bits might have a full-scale value of 11111111 (255 decimal, FF hexadecimal). The full-scale value may correspond to a full-scale voltage of 1.25 volts. When the ADC digitizes a 1 volt signal, the digital result is an arbitrary binary number, such as 11001100 (204 decimal, CC hex). There is often a need to provide the ADC results in a more user-friendly format. For example, it is often desirable to display the ADC result for the 1-Volt signal as 1000 millivolts (1111101000 binary).

To convert digital values expressed in an arbitrary unit to a natural unit, a slope/offset conversion equation is often used. The relationship between the digital value and the natural unit value is expressed as:

$$D_N = mD_A + c, \qquad \text{Eq. (1)}$$

where $D_N$ is the desired digital output value in a natural unit, $D_A$ is the digital input value to be converted in an arbitrary unit, m is a slope coefficient, and c is an offset coefficient.

In the case of a digitized voltage value, the relationship between the digitized voltage value in an arbitrary ADC unit and the voltage value in a natural unit can be expressed as:

$$V_n = mV_{ADC} + c, \qquad \text{Eq. (2)}$$

where $V_n$ is the desired digital output voltage value in a natural unit (e.g. volts or millivolts), $V_{ADC}$ is the digitized voltage value to be converted in an arbitrary unit, m is a slope coefficient, and c is an offset coefficient. When applied to the example given above where an 8-bit full-scale range represents 1.25 volts, a slope coefficient m of 4.90196 and an offset coefficient c of 0 can be used to perform the numerical value conversion between the arbitrary ADC unit and the natural unit. Thus, the conversion equation is given as:

$$V_n = 4.90196 V_{ADC}.$$

When $V_{ADC} = 204$, then $V_n = 1000$. By performing the numerical value conversion, the ADC result can be meaningfully expressed as a value in millivolts. The computation of the numerical value conversion is performed by an arithmetic logic unit (ALU), which has built-in multiplication and addition functions. In conventional systems, the coefficients m and c are often treated as constants, provided from registers or memory. However, in accordance with the present invention, a set of coefficients m and c are provided and stored in a look-up table such that the values of the coefficients used for the conversion can be selected based on other parameters. For example, the coefficients can be selected based on the operating conditions or parameters of the system providing the digital values. In this manner, a more accurate numerical value conversion can be realized. Alternately, more complex numerical value conversions can also be implemented with simplified circuitry.

FIG. 1 is a schematic diagram of a device for performing numerical value conversion using a look-up table for coefficient storage according to one embodiment of the present invention. Referring to FIG. 1, the numerical value conversion device receives a source of digital input values from an ADC 12. The digital input values are provided to an ALU 16 on a bus 14. ALU 16 also receives slope and offset coefficients from a look-up table 20. Look-up table 20 is indexed by a system parameter, referred herein as "P1," and provides a selected pair of slope and offset coefficients on bus 18 to ALU 16. ALU 16 performs the numerical conversion of the digital input values on bus 14 using the coefficients supplied on bus 18 based on Equation (1) above. A digital value in the desired natural unit is provided on an output port 22 of ALU 16.

Look-up table 20 can be implemented as a memory unit, such as a random-access memory. In the present embodiment, look-up table 20 stores pairs of slope m and offset c coefficients. The pairs of coefficients are related to the system parameter P1. System parameter P1 can represent characteristics or operating conditions of the system in which the analog data source is generated or of the system in which the digital input values is generated, such as the ADC. For example, in one embodiment, the pairs of coefficients are a function of the operating temperature. By using a set of coefficients m and c that depends on the desired system parameter, the numerical value conversion process can be tailored specifically to provide the desired output values in a natural unit.

Coefficients Indexed by Temperature

Figure 2:
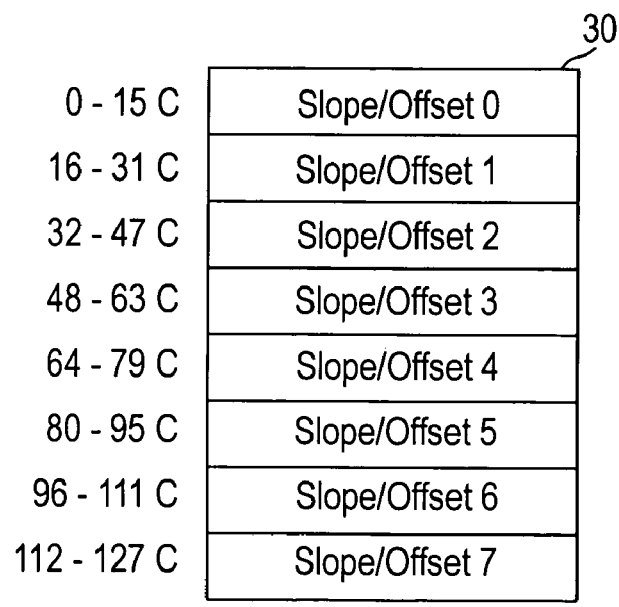
FIG. 2 illustrates a look-up table that uses temperature as an index into a memory-based table of coefficient pairs.

In one embodiment of the present invention, the numerical value conversion device includes a look-up table storing coefficients that are indexed by temperature as the indexing parameter. FIG. 2 illustrates a look-up table 30 that uses temperature as an index into a memory-based table of coefficient pairs. In the embodiment shown in FIG. 2, each entry of the look-up table includes a pair of coefficients—the slope m and the offset c. Each entry is indexed by a 16° C. temperature range. Thus, a total temperature range from 0 to 127° C. is divided into eight entries in look-up table 30.

In the present embodiment, the temperature used to index the look-up table is the operating temperature of the analog-to-digital converter providing the source of digital input values to ALU 16 (FIG. 1). That is, the temperature of ADC 12 is used as the indexing parameter. Because the behavior of the ADC may vary depending on the operating temperature, a numerical value conversion method using coefficients that are selected on the operating temperature can provide more accurate converted values. In other embodiments, the temperature used to index the look-up table can be a temperature value measured at any location of interest. For example, the system in which the numerical value conversion device is incorporated may include terminals for coupling to remote temperature sensors for providing the temperature values of interest.

Figure 3:
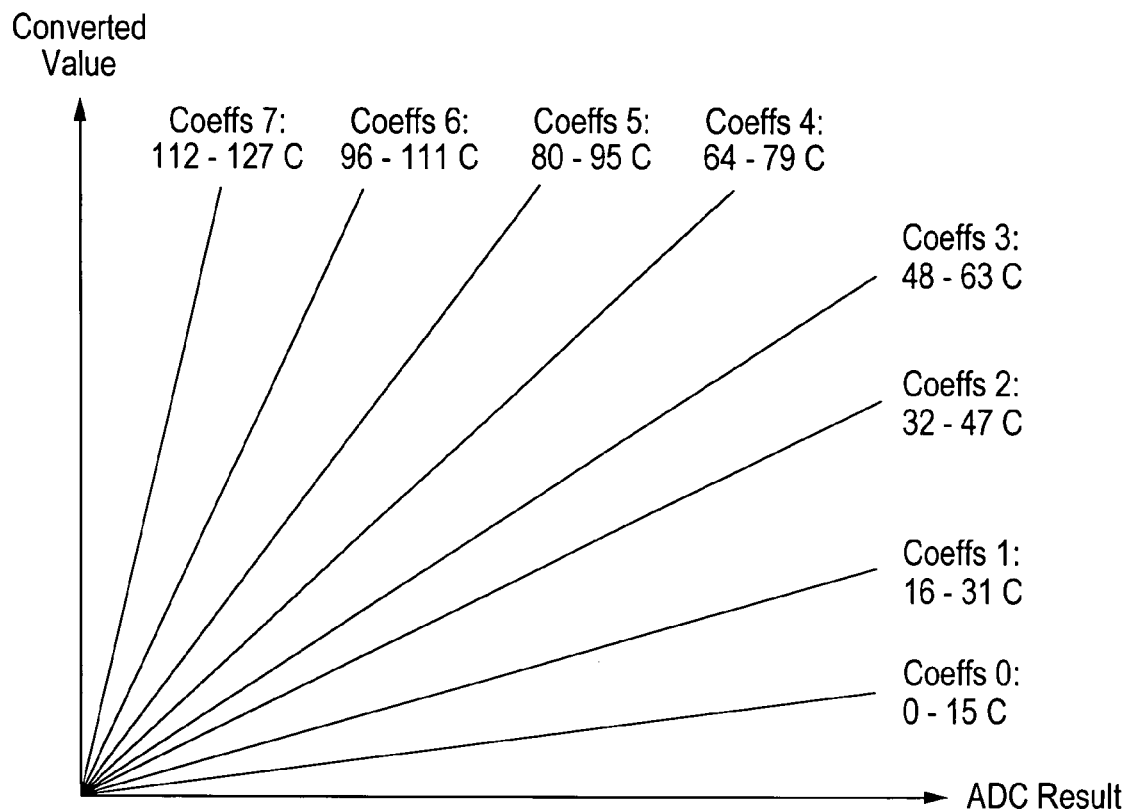
FIG. 3 is a graph illustrating the effect of using coefficients that are dependent on temperature for converting ADC results.

When a numerical value conversion is to be carried out, the operating temperature is used to index look-up table 30 to retrieve the corresponding pair of coefficients. For example, when the system temperature is 25° C., the second coefficient pair (Slope/Offset 1) will be retrieved from look-up table 30 entry 1 and delivered to the ALU. FIG. 3 is a graph illustrating the effect of using coefficients that are dependent on temperature for converting ADC digital values. Referring to FIG. 3, the conversion of the ADC results in arbitrary unit into converted values of a selected natural unit is linear for each given temperature range. By using a set of temperature-dependent coefficients, the numerical value conversion device enables the ADC system to temperature compensate the numerical value conversion. In the present illustration, the offset coefficients, c, are assumed to be zero. A zero offset value is useful when the system requires that a zero ADC result corresponds to a zero converted value at a particular temperature.

The temperature compensation provided by using temperature-dependent coefficients stored in look-up table 30 is a useful feature in most real systems as system behaviors are often highly dependent on temperature. Referring to FIG. 3, due to the nature of a typical ADC, a given ADC result may correspond to different converted values depending on the operating temperature. Thus, by using a set of temperature-dependent coefficients, accurate conversion of ADC results into values in the desired natural unit is realized.

FIG. 2 illustrates the use of a look-up table to store temperature-dependent coefficients for use in the numerical value conversion device and method of the present invention. In other embodiments, the look-up table can store coefficients that are dependent on other parameters, such as operating voltage or power. In general, look-up table 30 can be used to store coefficients as a function of system parameters that have a linear relationship between the digital input values and the converted values.

Coefficients Indexed by ADC Result

While the method described above with reference to FIGS. 1 and 2 can be used to facilitate numerical value conversion for system parameters that have a linear relationship between the digital input values and the converted values, in some applications, the relationship between the digital input values and the chosen set of natural units is non-linear. For example, an ADC might digitize a voltage signal, but a digital value in Decibels (dB) is desired. The relationship between voltage and Decibel is in a logarithmic scale, not linear. In this case, the non-linear relationship can be expressed as a polynomial with coefficients and exponents as follows:

$$V_n = m_1 V + m_2 V^2 + m_3 V^3 + m_4 V^4 + c,$$  Eq. (3)

where $V_n$ is the desired output voltage value in Decibels, V is the digitized voltage value to be converted in an arbitrary unit, $m_1$ to $m_4$ are the polynomial coefficients and c is an offset coefficient. While it is possible to build an ALU to evaluate such a polynomial, the resulting ALU is usually very slow and large in size making such implementation undesirable. In applications where speed or device size is critical, direct calculation using an ALU is not practical.

Figure 4:
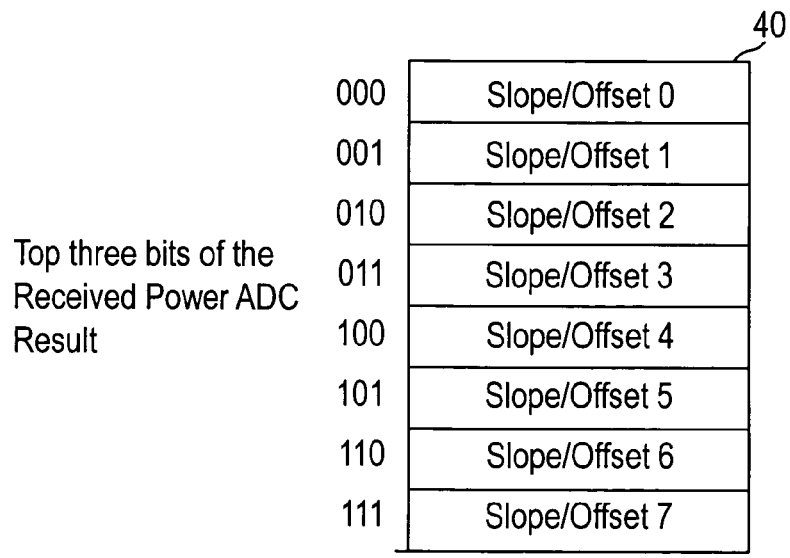
FIG. 4 illustrates a look-up table that implements numerical value conversion using a piecewise-linear approach.

In accordance with an alternate embodiment of the present invention, a numerical value conversion device supports non-linear conversion by using coefficients that implement a piecewise-linear conversion. FIG. 4 illustrates a look-up table 40 that implements numerical value conversion using a piecewise-linear approach. Referring to FIG. 4, look-up table 40 includes entries for storing pairs of slope and offset coefficients. Look-up table 40 uses the top three bits (the most significant three bits) of the digital input values to be converted as the index to the memory-based table of coefficient pairs. Using the top three bits of the digital input values as an index effectively partitions the range of the digital input values into small regions where each region employs a linear conversion of the digital input value to the desired converted output value. Each entry of the look-up table thus includes coefficients associated with a region of the digital input values. In this manner, a piecewise-linear conversion is implemented to approximate the non-linear relationship between the digital input value and the converted value.

In one embodiment, the numerical value conversion is used to operate on a parameter called "Received Power" which is a measurement of the amount of energy received by a photodiode at the end of an optical fiber. There is a non-linear relationship between the photodiode's output (measured as a voltage) and the desired output result, a value to be expressed in Decibels. The numerical value conversion device for converting a digitized voltage value into a value in Decibels unit operates as follows. First, a digital input value is provided to the numerical value conversion device. In the present embodiment, the digital input value is provided by an ADC digitizing the photodiode's output voltage into a digital input value having an arbitrary unit. Then, the most significant three bits of the digital input value are used to index look-up table 40 to select one of eight pairs of slope and offset coefficients. Returning to FIG. 4, the eight entries of the look-up table are indexed by three digital bits from 000 to 111. When an entry is selected using the three most significant bits of the digital input value, the slope and offset coefficients of the entry is retrieved and sent to the ALU for performing the conversion of the digital input value.

Figure 5:
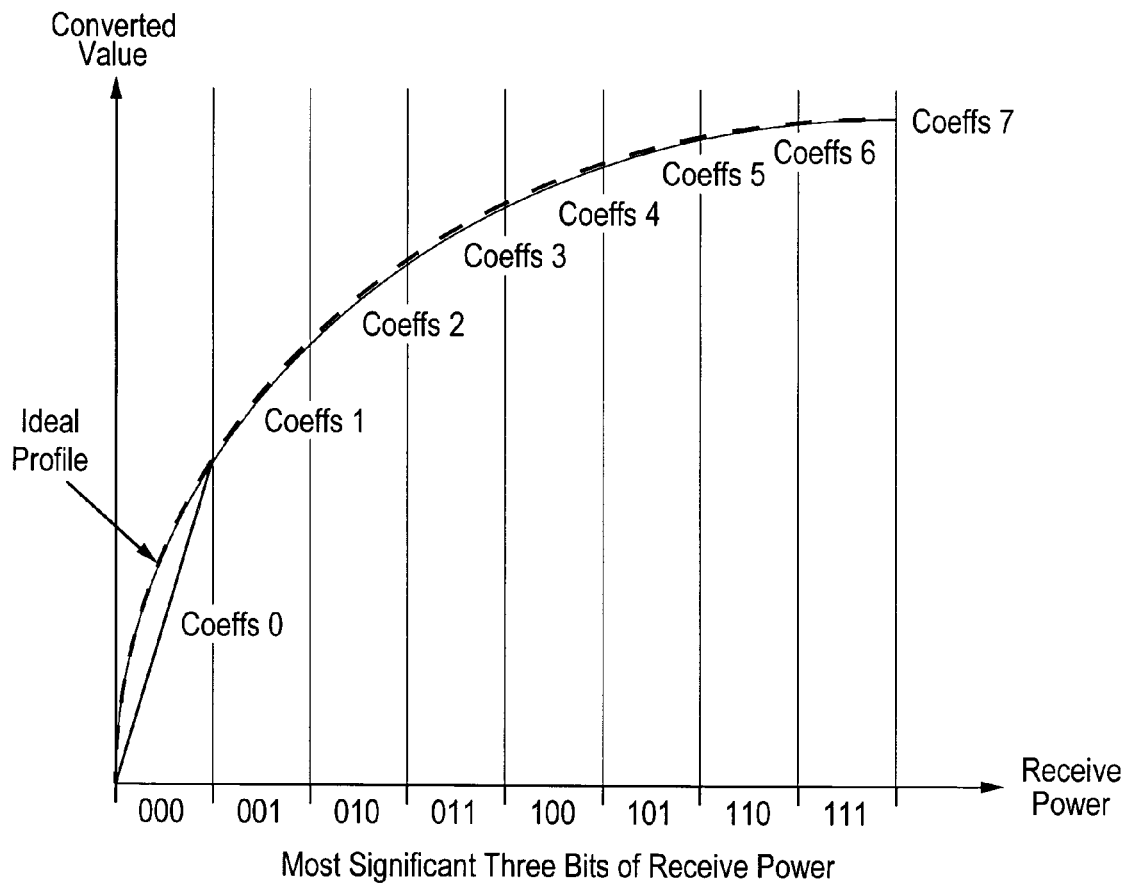
FIG. 5 is a graph illustrating the effect of using the look-up table of FIG. 4 to implement a piecewise-linear approach for approximating a non-linear conversion relationship.

The effect of the piecewise-linear conversion is shown in FIG. 5. The dotted-line curve represents the ideal logarithmic conversion from the ADC results (a digitized voltage value) to a converted value in dB. The solid-line curve represents the piecewise-linear approximation of the conversion using look-up table 40 of FIG. 4. The use of the most significant three bits of the ADC result partitions the range of digital input values into eight regions, each region being assigned its own pair of slope and offset coefficients. By careful selection of coefficients (slope and non-zero offset), adjacent regions of the linear curve can join accurately so that no discontinuities are observed in the converted result.

In the above description, the digital input value has 8 bits and the most significant 3 bits are used as the indexing parameter. Using the most significant 3 bits is illustrative only. In other embodiments, the digital input value has N bits and the most significant k bits are used as indexing parameter where k is less than N. The number of bits used as indexing parameter determines the size of each piecewise-linear partition and the total number of partitions used to approximate the full range of digital input values.

Figure 6:
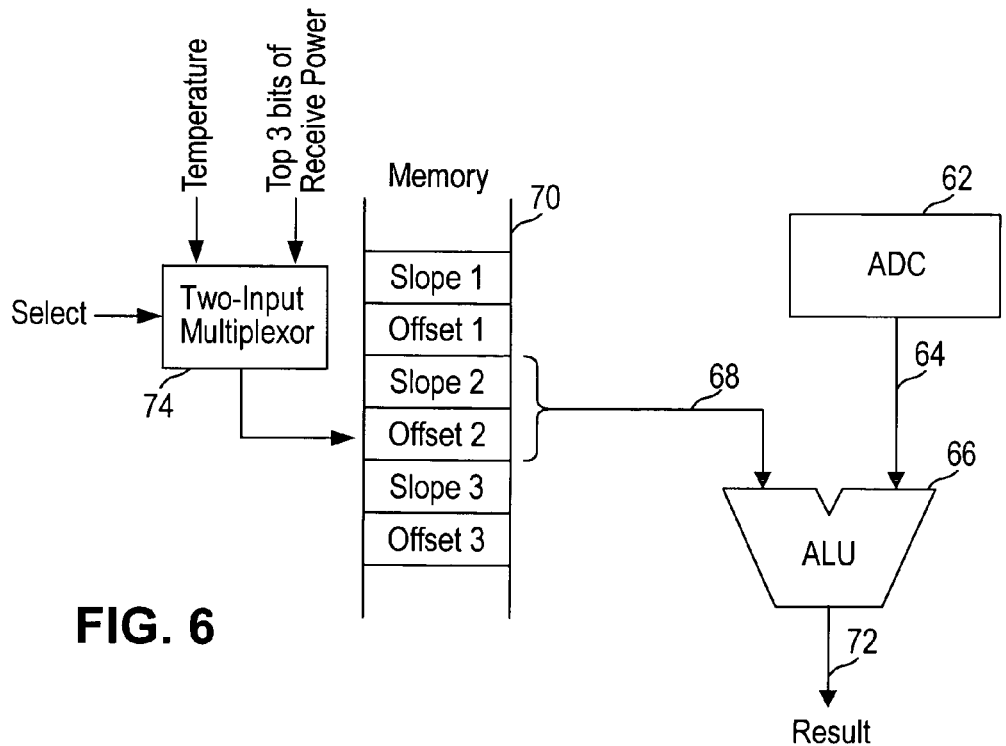
FIG. 6 is a schematic diagram of a device for performing numerical value conversion using a look-up table for coefficient storage according to an alternate embodiment of the present invention.

FIG. 6 is a schematic diagram of a device for performing numerical value conversion using a look-up table for coefficient storage according to an alternate embodiment of the present invention. Referring to FIG. 6, an ADC 62 provides a source of digital input values on a bus 64 to an ALU 66 to be converted to a digital output value having a desired natural unit. The coefficients for performing the conversion are stored in a look-up table 70. In the present embodiment, look-up table 70 is designed to be indexed by multiple parameters. Specifically, the look-up table is indexed by a temperature parameter and a Received Power parameter (top three bits). A multiplexor 74 is coupled to select one of the two indexing parameters based on a Select signal. By incorporating multiplexor 74 to select between two indexing parameters, the numerical value conversion device can be selectively operated for temperature compensation or for non-linear conversion.

In operation, the Select signal is asserted to select either the temperature or the Received Power as the indexing parameter. When the multiplexor selects temperature as the indexing parameter, an operating temperature value is used to select a pair of slope and offset coefficients. The selected coefficients are provided to ALU 66 on a bus 68. A linear conversion from the digital input value to the converted output value results. In the manner, temperature compensation of the ADC results is realized. When the multiplexor selects Received Power as the indexing parameter, the most significant 3 bits of the Received Power value is used to select a pair of slope and offset coefficients where the full 8 bits of the digital input value indicative of the Received Power is provided to ALU 66. A piecewise-linear conversion from the digital input value to the converted output value thus results.

The use of a look-up table for storing coefficients for numerical value conversion in accordance with the present invention provides numerous advantages not realized by prior art systems. First, the numerical value conversion method stores only the coefficients used in the conversion computation. Thus, only a small amount of memory is needed and the size of the look-up table is minimized for optimal integration. The numerical value conversion device of the present invention is distinguishable from prior art systems where a look-up table may be used to store a large amount of scalar values which scalar values are used for scaling a binary value to another binary value, both binary values in arbitrary units. Such prior art systems require large amount of memory to implement and often do not provide numerical value conversion of the digital input values into values of a desired natural unit.

Second, the numerical value conversion device of the present invention enables linear or non-linear conversion to be performed. Furthermore, the look-up table for storing coefficients can be indexed by one or more parameters depending on the application. Finally, by using a look-up table for coefficient storage, complex numerical value conversion can be performed with simple and minimum circuitry. As a result, an optimized coefficient storage mechanism is realized for efficient numerical value conversion.

Saturated Limited ALU Supporting Variable Bit-Length Operands

In the numerical conversion device described above, an ADC provides a source of digital input values for the ALU to perform numerical value conversions. While in most applications the ADC is used to digitize a single source of analog data, in some applications, the ADC may be coupled to digitize analog data from multiple sources. For example, in an optical transceiver, a single analog-to-digital converter may be used to measure temperature, voltage, bias current, transmit power and received power. In that case, in order to convert each digitized result into the appropriate natural unit for the data source, the ALU must be provided with the appropriate pairs of coefficients m and c for the respective data source.

In accordance with the present invention, a numerical value conversion device is provided to support numerical value conversion of digital input values derived from multiple data sources, also referred to as input channels. The numerical value conversion device includes a look-up table storing coefficients associated with each data source. In this manner, the appropriate coefficients for the digital input value being processed can be retrieved by indexing the look-up table and providing the coefficients to the ALU. Furthermore, in accordance with the present invention, the numerical value conversion device includes an ALU that supports digital input values (operands) having variable resolution or variable bit-length. The ALU is also capable of providing digital output values having variable resolution. Finally, the numerical value conversion device includes an ALU that is saturation-limited so that a reasonable output value is always provided regardless of possible errors in the digital input values.

Figure 7:
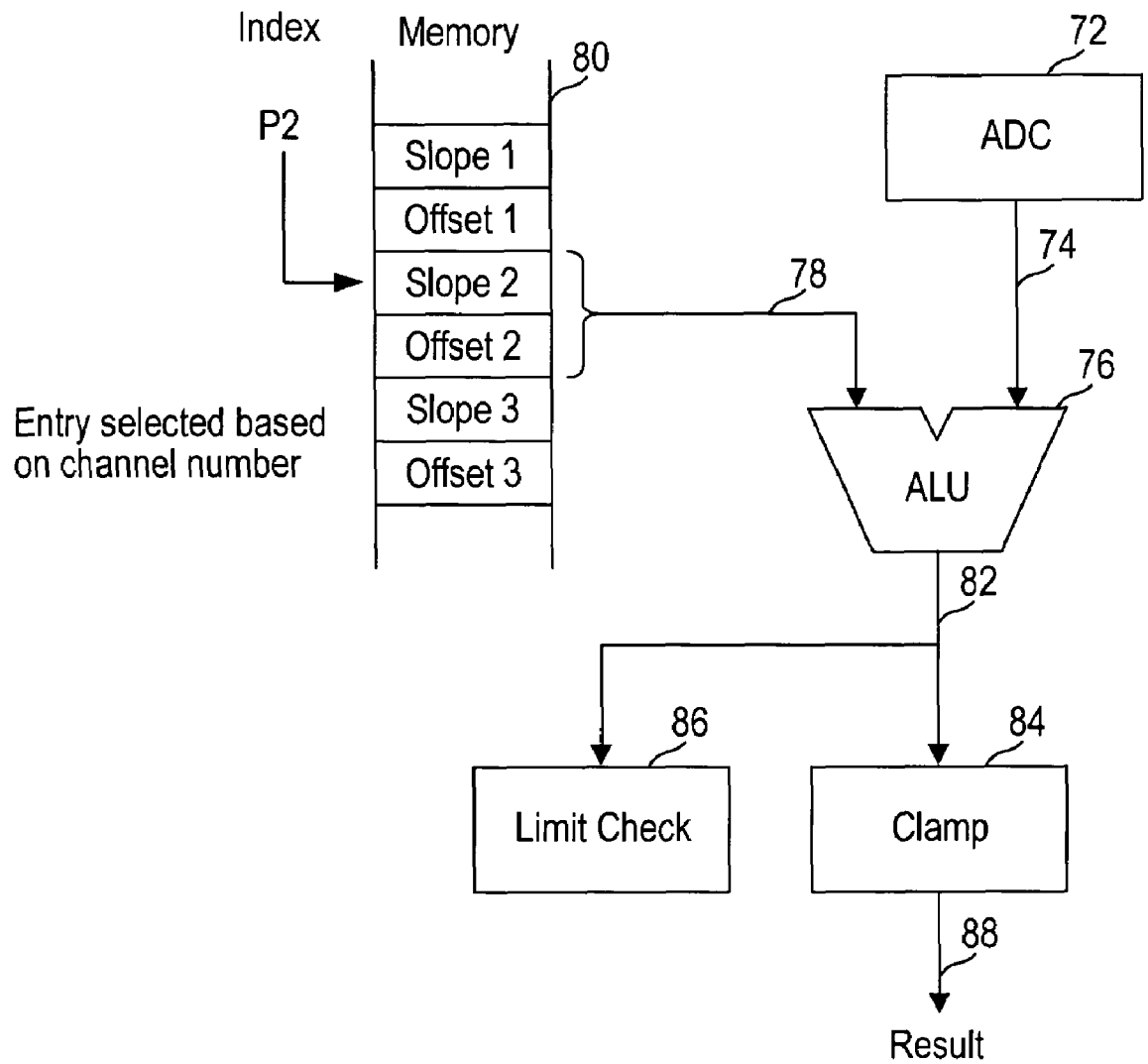
FIG. 7 is a schematic diagram of a device for performing numerical value conversion using a look-up table for coefficient storage and a saturation limited ALU according to one embodiment of the present invention.

FIG. 7 is a schematic diagram of a device for performing numerical value conversion using a look-up table for coefficient storage and a saturation limited ALU according to one embodiment of the present invention. Referring to FIG. 7, the numerical value conversion device receives a source of digital input values from an ADC 72. The digital input values in arbitrary units are provided to an ALU 76 on a bus 74. In the present embodiment, ADC 72 is disposed to digitize multiple analog data sources. In the present description, each analog data source is also referred to as an input channel or a measurement parameter. The digital input values provided by ADC 72 on bus 74 can be digitized values of the various analog data sources provided in sequence or in random order. In one embodiment, the numerical value conversion device of the present invention is incorporated in an optical transceiver and ADC 72 is disposed to measure and digitize the following measurement parameters: temperature, voltage, bias current, transmit power and received power. Therefore, ALU 76 will receive from ADC 72 digital input values belonging to the different measurement parameters being measured in sequence.

In the numerical value conversion device of the present invention, ALU 76 receives digital input values belonging to the different analog data sources (measurement parameters) being measured by ADC 72 where the digital input values are expressed in arbitrary units. ALU 76 operates to convert the digital input values into the appropriate natural units for the measurement parameters. For example, a digital input value of temperature should be converted into a value in degree Centigrade and a digital input value of voltage should be converted into a value in volts. For each measurement parameter, a separate set of coefficients must be used. In the present embodiment, ALU 76 receives the coefficients for performing the numerical value conversion from a look-up table 80. In the present embodiment, the arbitrary unit of the digital input values is assumed to have a linear relationship with the respective natural unit described by Equation (1) above. Thus, look-up table 80 stores pairs of slope m and offset c coefficients for each measurement parameter measured by ADC 72.

Look-up table 80 is indexed by an indexing parameter P2 for selecting one set of slope and offset coefficients. Depending on the digital input value currently being provided to ALU 76, indexing parameter P2 operates to retrieve a selected pair of slope and offset coefficients and provide the coefficients on bus 78 to ALU 76. Using the selected coefficients, ALU 76 performs the numerical conversion of the digital input values received on bus 74 based on Equation (1) above. A digital output value in the desired natural unit is provided on an output port 82 of ALU 76. Look-up table 80 can be implemented as a memory unit, such as a random-access memory.

Thus, in accordance with the present invention, a single ALU is used for converting digital input values belonging to multiple measurement parameters (analog data sources). Depending on the measurement parameter currently being supplied to ALU 76, the appropriate set of coefficients is retrieved from look-up table 80 and fed to ALU 76 for use in the conversion of the digital input value.

Furthermore, in the present embodiment, ALU 76 is disposed to support digital input values (operands) having variable resolution or variable bit-length. This feature is particularly useful as ADC 72 does not necessarily digitize each analog data source to a digital result with identical numbers of bits. For instance, some analog data source may be digitized to a finer resolution than others. For example, temperature measurements might be digitized to an eight-bit resolution, allowing a range from −128 to +127 Centigrade (one degree Centigrade resolution). In the same system, voltage measurements might be digitized to a 12-bit resolution, allowing a range of 0 to 4095 millivolts (one millivolt resolution). ALU 76 therefore supports and converts ADC results (also referred to as "operands") with different bit-length or with variable resolution. The ALU is also capable of providing digital output values having variable resolution.

Figure 8:
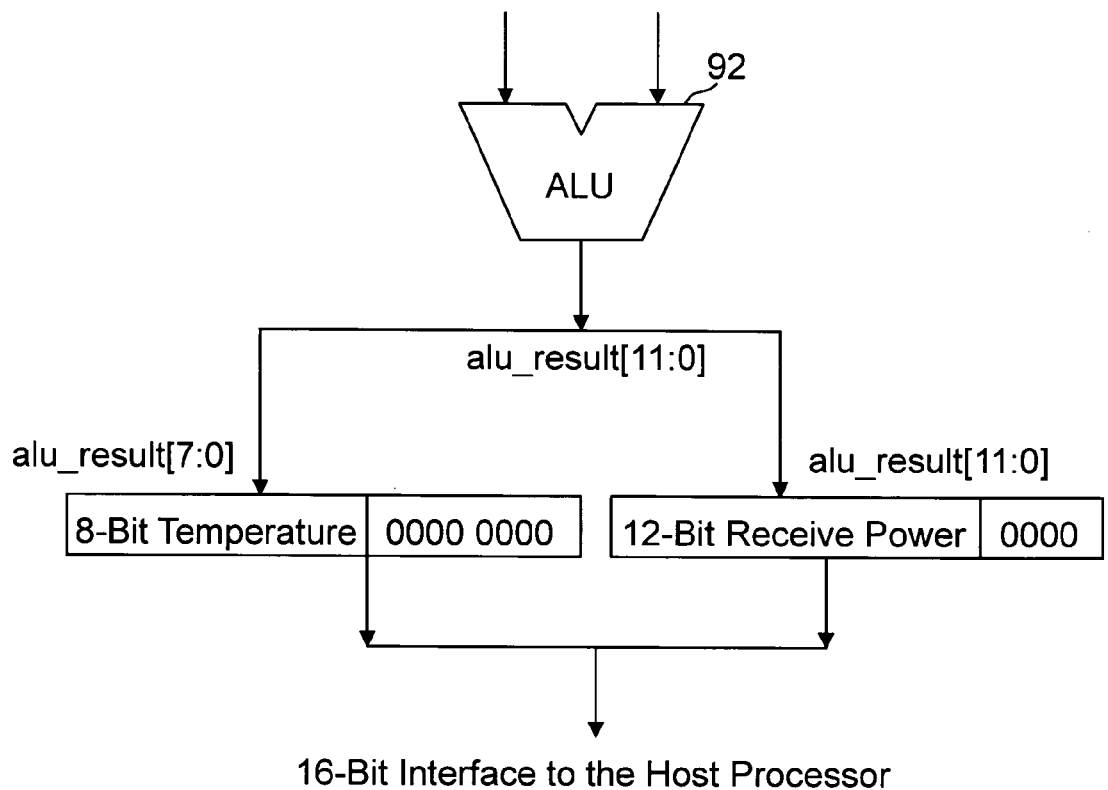
FIG. 8 is a schematic unit of an ALU implementing variable bit-length operands according to one embodiment of the present invention.

FIG. 8 is a schematic unit of an ALU implementing variable bit-length operands according to one embodiment of the present invention. Referring to FIG. 8, an ALU 92 receives input values (operands) having variable bit-lengths and produces a native ALU result in P bits. In the present embodiment, ALU 92 is assumed to produce a native 12-bit result, denoted as alu_result[11:0] in FIG. 8. The host processor may require the ALU results to be presented in Q bits. In the present embodiment, the host processor is assumed to require an ALU result of 16-bit. To accommodate the variable bit-length operands, the ALU operates to select a portion or all of the P bits of the native ALU result and add trailing zeros to the selected portion to generate a final ALU result of the desired bit-length. For example, when the input values are digitized voltage values expressed in all 12 bits of the native ALU result, the ALU circuit pads the 12-bit ALU result with additional four zeros to generate a final 16-bit ALU result. The four zeros are added as least significant bits of the final 16-bit ALU result. Alternately, when the input values are digitized temperature values expressed in only 8 bits of the native ALU result, the least significant 8 bits of the 12-bit native ALU result (alu_result[7:0]) is selected. The ALU circuit pads the selected 8-bit ALU result with additional eight zeros to generate a final 16-bit ALU result. The eight zeros are added as least significant bits of the final 16-bit ALU result. By varying the choice of the bits selected from the native ALU result and by changing the number of padding zeros, the ALU can support variable bit-length operands and can also provide results with varying bit-length.

Finally, in the present embodiment, the ALU is saturation-limited to ensure that a reasonable output value is always provided by the numerical value conversion device of the present invention regardless of possible errors in the digital input values. Conversion errors can occur when the digital input values delivered to the ALU are beyond the ALU's normal scope of computation. For example, consider what occurs if a voltage measurement is converted according to the formula:

$$V_n = 100 V_{ADC},$$

where $V_{ADC}$ is the digital input value in arbitrary unit of a digitized voltage measurement and $V_n$ is the converted value in the unit millivolt. Assume for the present example that $V_n$ is a 12-bit value and $V_{ADC}$ is an 8-bit value. $V_n$'s maximum value is therefore 4095 (that is, $2^{12}-1$). If $V_{ADC}$ exceeds 50, then $V_n$ will exceed 4095. This imposes a maximum bound on the values of $V_{ADC}$. In unusual circumstances, the maximum value of $V_{ADC}$ might be violated, as a result of an erratic or excessive input or some other conditions. When this occurs, the converted value $V_n$ will be beyond its maximum value and the ALU will return a faulty result.

Thus, in the present embodiment, the numerical value conversion device imposes a saturation limitation on the ALU's output result. Referring to FIG. 7, output port 82 of ALU 76 is coupled to a limit check circuit 86 and a clamp circuit 84. Limit check circuit 86 monitors the output result from ALU 76. Clamp circuit 84, depending on the control signal provided by limit check circuit 86, will either pass the ALU output result onto output port 88 or clamp the ALU output result to a predetermined maximum value, such as 4095 in the above example.

In the present embodiment, the numerical value conversion device also operates to limit the lower bound of the ALU result. Thus, if the conversion process produces a negative result, the limit check circuit will detect the condition and instruct the clamp circuit to clamp the output result to zero. The lower-bound saturation limitation is optional and can be included in the numerical value conversion device of the present invention as desired.

The operation of the numerical value conversion device of FIG. 7 is as follows. ADC 72 provides a binary representation of a digital input value of one of several measurement parameters being measured by the ADC. The binary representations for the different analog data source may be of different bit lengths. The numerical value conversion device, using indexing parameter P2, retrieves a pair of coefficients (m, c) from look-up table 80 to ALU 76. The value of indexing parameter P2 is based on the measurement parameter of the ADC currently being measured. ALU 76 performs the computation on the digital input value provided on bus 74 based on the equation:

$$D_n = m D_{ADC} + c, \qquad \text{Eq. (4)}$$

using the coefficients m, c provided by look-up table 80. $D_{ADC}$ is the digital input value and $D_n$ is the digital output value in the desired natural unit.

After the value $D_n$ is computed, limit check circuit 86 determines if the ALU's result ($D_n$) is greater than a maximum value or less than a minimum value. If the ALU's result ($D_n$) exceeds the maximum value, limit check circuit 86 instructs clamp circuit 84 to output a predetermined result, usually the maximum allowable output value, on output port 88. If the ALU's result ($D_n$) is less than the minimum value, limit check circuit 86 instructs clamp circuit 84 to output a predetermined result, usually the minimum allowable output value or zero, on output port 88. If the ALU's result ($D_n$) is within the maximum value and the minimum value, no instruction is issued from limit check circuit 86 and clamp circuit 84 passes the value $D_n$ received on port 82 on output port 88.

In this manner, the numerical value conversion device of the present invention operates to convert a digital input value in arbitrary unit into a digital output value in a natural unit which digital output value is guaranteed to contain a reasonable value.

Figure 9:
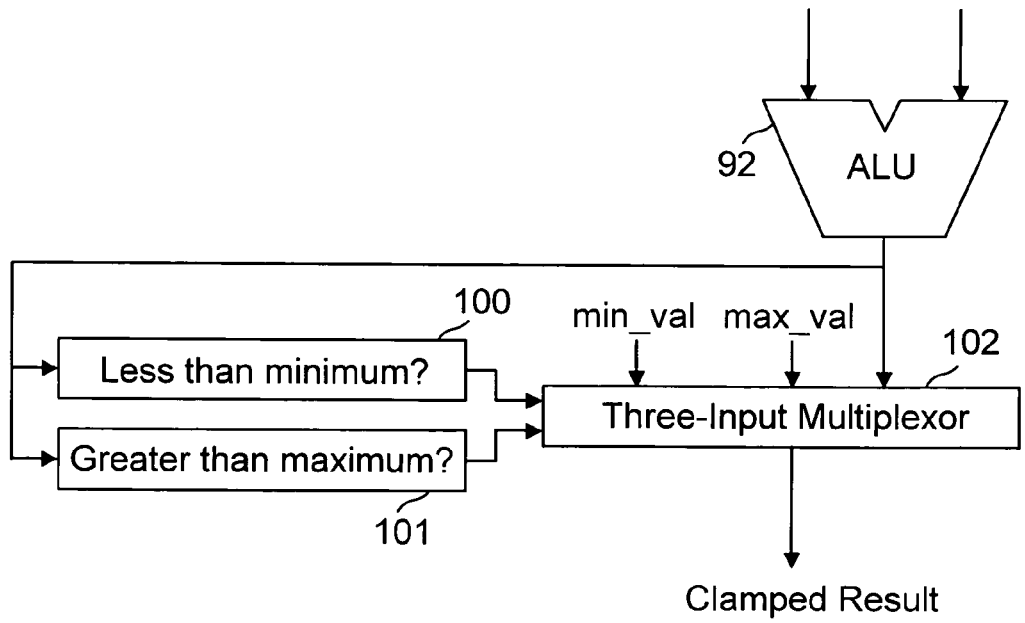
FIG. 9 is a schematic diagram of one embodiment of a clamp circuit which can be used in the numerical value conversion device of the present invention.

FIG. 9 is a schematic diagram of one embodiment of a clamp circuit which can be used in the numerical value conversion device of the present invention. Referring to FIG. 9, ALU 99 provides an ALU result which is coupled to a first comparator 100. The ALU result is compared with a predetermined minimum value to determine if the ALU result is less than the predetermined minimum value. If the ALU result is less than the predetermined minimum value, the output of comparator 100 is asserted. The ALU result is also coupled to a second comparator 101. The ALU result is compared with a predetermined maximum value to determine if the ALU result is greater than the predetermined maximum value. If the ALU result is greater than the predetermined maximum value, the output of comparator 101 is asserted. The output signals from comparator 100 and comparator 101 are coupled to a three-input multiplexor 102 as select signals. Multiplexor 102 receives a minimum allowable output value, a maximum allowable output value, and the ALU result as input signals from ALU 99. Depending on the values of the select signals, one of the three input signals will be selected. If the output signal from comparator 100 is asserted, then multiplexor 102 will select the minimum allowable output value as the clamped result. If the output signal from comparator 101 is asserted, then multiplexor 102 will select the maximum allowable output value as the clamped result. If neither output signals are asserted, then multiplexor 102 will select the ALU result as the clamped result. That is, the unmodified ALU result is passed through the clamp circuit.

According to another aspect of the present invention, ALU 76 is implemented as a fixed-function ALU. That is, ALU 76 is designed to be able to only perform the multiplication and addition operations required to implement the slope/offset calculation in equation (4) above. By using a fixed-function ALU, instead of a conventional full-function ALU, the size of the ALU can be minimized. A numerical value conversion device using a fixed function ALU is particularly advantageous when high speed operation and small device size are desired. In particular, a fixed-function ALU is suitable when the device needs to be constructed as a small form-factor integrated circuit.

In the above description, the numerical value conversion device performs linear conversions between the digital input values in the arbitrary unit and digital output values in the natural unit. In other embodiments, the numerical value conversion device can also operate to perform non-linear conversions using a piecewise-linear approach as described above.

In the present embodiment, the numerical value conversion device of the present invention provides numerous advantages. First, a memory, in the form of a look-up table, is used to store separate coefficients for each analog data source or measurement parameter being processed. In this manner, a single ALU can be used to convert digital values from multiple analog data sources. Second, the numerical value conversion device can support digital input values having variable resolution operands. Thus, the device can support multiple analog input channels that are digitized to different resolutions. Third, the numerical value conversion device is saturation-limited so that a reasonable value is returned regardless of possible errors in the digital input values. Lastly, when a fixed-function ALU is used, the numerical value conversion device can be optimized in speed and size.

The above detailed descriptions are provided to illustrate specific embodiments of the present invention and are not intended to be limiting. Numerous modifications and variations within the scope of the present invention are possible. The present invention is defined by the appended claims.

We claim:

1. A device for performing numerical value conversion, optimizing in speed and size, of an N-bit digital input value in a first unit being an arbitrary unit to a second unit being a natural unit, the second unit expressed in a natural unit of physical measurement and being related to the first unit by a first equation, the N-bit digital input value being a digitized value of a first measurement parameter selected from among a plurality of measurement parameters, the device comprising:

a memory having stored thereon a look-up table storing a plurality of coefficients for performing the numerical value conversion from the first unit to the second unit for each of the plurality of measurement parameters, the look-up table being indexed using a first parameter to provide a selected coefficient pair of slope and offset coefficients, the first parameter being indicative of the first measurement parameter;

an arithmetic logic unit receiving the N-bit digital input value in the first unit and the selected coefficient pair of slope and offset coefficients from the look-up table, the arithmetic logic unit performing the numerical value conversion based on the first equation and using the N-bit digital input value and the selected coefficient pair to compute a digital output value in the second unit; and a saturation-limit circuit coupled to receive the digital output value in the second unit from the arithmetic logic unit and provide a predetermined final output value when the digital output value exceeds a predetermined minimum or maximum value, wherein the plurality of measurement parameters comprise temperature, voltage, bias current, and transmit power and receive power of an optical transceiver and the first parameter, being indicative of one of the measurement parameters, is selected to operate the device for supporting numerical value conversion of digital input values derived from multiple data sources; and wherein the N-bit digital input value comprises a digital input value with variable bit-lengths, the variable bit-lengths comprising a first bit length and a second bit length different than the first bit length, the arithmetic logic unit generating a final digital output value being expressed in Q bits, the Q bits of the final digital output value comprising the digital output value of the arithmetic logic unit having the first bit length and trailing zeros or the digital output value having the second bit length and trailing zeros.

2. The device of claim 1, wherein the saturation-limit circuit provides a first predetermined final output value when the digital output value exceeds a predetermined maximum value and provides a second predetermined final output value when the digital output value is below a predetermined minimum value.

3. The device of claim 2, wherein the digital output value comprises values between a maximum output value and a minimum output value, the first predetermined final output value being the maximum output value and the second predetermined final output value being the minimum output value.

4. The device of claim 3, wherein the second predetermined final output value is zero.

5. The device of claim 1, wherein the arithmetic logic unit comprises a fixed-function arithmetic logic unit capable of performing only multiplication and addition operations.

6. The device of claim 1, wherein the numerical value conversion from the arbitrary unit to the natural unit has a linear relationship described by the equation $D_N = m\, D_A + c$, where $D_A$ is the digital input value, $D_N$ is the digital output value, m is a slope coefficient and c is an offset coefficient, and the plurality of coefficients comprises a plurality of coefficient pairs for each of the plurality of measurement parameters, each coefficient pair comprising a slope coefficient and an offset coefficient.

7. The device of claim 1, wherein the numerical value conversion for the selected measurement parameter from the arbitrary unit to the natural unit has a non-linear relationship and the plurality of coefficients comprises a first set of coefficients for the selected measurement parameter, the first set of coefficients implementing the numerical value conversion in a piecewise-linear fashion approximating the non-linear relationship.

8. The device of claim 7, wherein the first set of coefficients comprises coefficients for a plurality of linear segments for performing the piecewise-linear numerical value conversion, each linear segment being described by the equation $D_N = m\, D_A + c$, where $D_A$ is the digital input value, $D_N$ is the digital output value, m is a slope coefficient and c is an offset coefficient for the respective linear segment, and the first set of coefficients comprises a plurality of coefficient pairs, each coefficient pair comprising a slope coefficient and an offset coefficient for the respective linear segment.

9. A method for performing numerical value conversion, optimizing in speed and size, of an N-bit digital input value in a first unit being an arbitrary unit to a second unit being a natural unit, the second unit expressed in a natural unit of physical measurement and being related to the first unit by a first equation, the N-bit digital input value being a digitized value of a first measurement parameter selected from among a plurality of measurement parameters, the method comprising:

storing a plurality of coefficients in a look-up table stored in a memory for performing the numerical value conversion from the first unit to the second unit, each of the plurality of measurement parameters being associated with at least one of the plurality of coefficients, the plurality of measurement parameters comprising temperature, voltage, bias current, and transmit power and receive power of an optical transceiver;

indexing the look-up table using a first parameter being indicative of the first measurement parameter to provide a selected coefficient pair of slope and offset coefficients, the first parameter being selected for supporting numerical value conversion of digital input values derived from multiple data sources;

providing the N-bit digital input value and the selected coefficient pair of slope and offset coefficients to an arithmetic logic unit;

performing a numerical value conversion at the arithmetic logic unit based on the first equation and using the N-bit digital input value and the selected coefficient to compute a digital output value in the second unit from the digital input value in the first unit, wherein the N-bit digital input value comprises a digital input value with variable bit-lengths, the variable bit-lengths comprising a first bit length and a second bit length different than the first bit length, the arithmetic logic unit generating a final digital output value being expressed in Q bits, the Q bits of the final digital output value comprising the digital output value of the arithmetic logic unit having the first bit length and trailing zeros or the digital output value having the second bit length and trailing zeros;

determining if the digital output value exceeds a predetermined maximum value;

providing a first predetermined value as the final output value when the digital output value exceeds the predetermined maximum value; and providing the digital output value as the final output value when the digital output value does not exceed the predetermined maximum value.

10. The method of claim 9, further comprising:

determining if the digital output value is less than a predetermined minimum value;

providing a second predetermined value as the final output value when the digital output value is less than the predetermined minimum value; and providing the digital output value as the final output value when the digital output value exceeds the predetermined minimum value.

11. The method of claim 9, wherein the digital output value comprises values between a maximum output value and a minimum output value, the first predetermined value being the maximum output value and the second predetermined value being the minimum output value.

12. The method of claim 9, wherein providing the digital input value and the selected coefficient to an arithmetic logic unit comprises:

providing the digital input value and the selected coefficient to a fixed-function arithmetic logic unit capable of performing only multiplication and addition operations.

13. The method of claim 9, wherein storing a plurality of coefficients in a look-up table stored in a memory for performing the numerical value conversion from the first unit to the second unit comprises:

storing a plurality of coefficients in the look-up table wherein the numerical value conversion from the arbitrary unit to the natural unit has a linear relationship described by the equation $D_N = m D_A + c$, where $D_A$ is the digital input value, $D_N$ is the digital output value, m is a slope coefficient and c is an offset coefficient, and the plurality of coefficients comprises a plurality of coefficient pairs for each of the plurality of measurement parameters, each coefficient pair comprising a slope coefficient and an offset coefficient.

14. The method of claim 9, wherein storing a plurality of coefficients in a look-up table stored in a memory for performing the numerical value conversion from the first unit to the second unit comprises:

storing a plurality of coefficients in the look-up table wherein the numerical value conversion from the arbitrary unit to the natural unit has a non-linear relationship and the plurality of coefficients comprises a first set of coefficients for the selected measurement parameter, the first set of coefficients implementing the numerical value conversion in a piecewise-linear fashion approximating the non-linear relationship.

15. The method of claim 14, wherein the first set of coefficients comprises coefficients for a plurality of linear segments for performing the piecewise-linear numerical value conversion, each linear segment being described by the equation $D_N = m D_A + c$, where $D_A$ is the digital input value, $D_N$ is the digital output value, m is a slope coefficient and c is an offset coefficient for the respective linear segment, and the first set of coefficients comprises a plurality of coefficient pairs, each coefficient pair comprising a slope coefficient and an offset coefficient for the respective linear segment.

* * * * *